US009548452B2

(12) United States Patent
Ito

(10) Patent No.: US 9,548,452 B2
(45) Date of Patent: Jan. 17, 2017

(54) METHOD FOR MANUFACTURING ORGANIC EL DISPLAY PANEL AND SYSTEM FOR MANUFACTURING ORGANIC EL DISPLAY PANEL

(71) Applicant: JOLED INC., Tokyo (JP)

(72) Inventor: Toyoji Ito, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/906,984

(22) PCT Filed: Apr. 17, 2015

(86) PCT No.: PCT/JP2015/002124
§ 371 (c)(1),
(2) Date: Jan. 22, 2016

(87) PCT Pub. No.: WO2015/162891
PCT Pub. Date: Oct. 29, 2015

(65) Prior Publication Data

US 2016/0172592 A1 Jun. 16, 2016

(30) Foreign Application Priority Data

Apr. 23, 2014 (JP) ................................ 2014-089668

(51) Int. Cl.
*H01L 21/00* (2006.01)
*H01L 51/00* (2006.01)
(Continued)

(52) U.S. Cl.
CPC ....... *H01L 51/0005* (2013.01); *H01L 27/3246* (2013.01); *H01L 51/0031* (2013.01);
(Continued)

(58) Field of Classification Search
CPC ... H01L 27/3246; H01L 51/0005; H01L 51/56
(Continued)

(56) References Cited

U.S. PATENT DOCUMENTS

2006/0249817 A1* 11/2006 Kawase .............. H01L 51/0022 257/622
2009/0146557 A1* 6/2009 Shinto ................ H01L 51/5237 313/504

(Continued)

FOREIGN PATENT DOCUMENTS

JP 2004-253214 9/2004
JP 2006-113423 4/2006

(Continued)

OTHER PUBLICATIONS

International Search Report, mailed Jul. 14, 2015, in corresponding International Application No. PCT/JP2015/002124.

*Primary Examiner* — David S Blum
(74) *Attorney, Agent, or Firm* — Greenblum & Bernstein, P.L.C.

(57) ABSTRACT

A method for manufacturing an organic electroluminescent (EL) display panel through a printing process of applying a raw material liquid between banks disposed on a board, the raw material liquid containing an organic EL material. The method includes, before the printing process: a detection process of detecting a contaminant A present on the board; an information generation process of generating, when the contaminant A is detected, position information indicating a position of the contaminant A; and a resin application process of applying an inhibitory resin to at least one of the contaminant A and a region in the vicinity of the contaminant A based on the position information.

5 Claims, 12 Drawing Sheets

(51) Int. Cl.

| | |
|---|---|
| ***H05B 33/10*** | (2006.01) |
| ***H01L 27/32*** | (2006.01) |
| ***H01L 51/50*** | (2006.01) |
| ***H01L 51/56*** | (2006.01) |

(52) U.S. Cl.
CPC .......... *H01L 51/5012* (2013.01); *H01L 51/56* (2013.01); *H05B 33/10* (2013.01); *H01L 2227/323* (2013.01)

(58) Field of Classification Search
USPC .............................................................. 438/5
See application file for complete search history.

(56) References Cited

U.S. PATENT DOCUMENTS

| | | | | |
|---|---|---|---|---|
| 2012/0228590 | A1* | 9/2012 | Matsumi | ............. H01L 51/5209 257/40 |
| 2015/0221709 | A1 | 8/2015 | Shimamura et al. | |

FOREIGN PATENT DOCUMENTS

| | | |
|---|---|---|
| JP | 2011-048984 | 3/2011 |
| JP | 2011-108369 | 6/2011 |
| JP | 2012-230852 | 11/2012 |
| JP | 2012-234647 | 11/2012 |
| JP | 2013-016342 | 1/2013 |
| JP | 2014-002983 | 1/2014 |
| WO | 2013/190841 | 12/2013 |

* cited by examiner

METHOD FOR MANUFACTURING ORGANIC EL DISPLAY PANEL AND SYSTEM FOR MANUFACTURING ORGANIC EL DISPLAY PANEL

TECHNICAL FIELD

The present disclosure relates to a method for manufacturing an organic electroluminescent (EL) display panel and a system for manufacturing an organic EL display panel, and relates in particular to a method for manufacturing an organic EL display panel and a system for manufacturing an organic EL display panel for which a printing technique is adopted.

BACKGROUND ART

Patent Literature (PTL) 1 discloses a method of manufacturing an organic EL display panel using a technique of applying a raw material liquid (functional liquid) between banks (partitions) disposed on a board.

CITATION LIST

Patent Literature

[PTL 1] Japanese Unexamined Patent Application Publication No. 2006-113423

SUMMARY OF INVENTION

Technical Problem

The present disclosure provides a method for manufacturing an organic EL display panel and a system for manufacturing an organic EL display panel which can deal with a contaminant stuck to a board before a printing process.

Solution to Problem

To achieve the above object, a method for manufacturing an organic EL display panel according to the present disclosure is a method for manufacturing an organic electroluminescent (EL) display panel through a printing process of applying a raw material liquid between a plurality of banks disposed on a board, the raw material liquid containing an organic EL material, the method including, before the printing process: a detection process of detecting a contaminant present on a surface of the board on which the plurality of banks are disposed; an information generation process of generating, when the contaminant is detected, position information indicating a position of the contaminant with respect to the board; and a resin application process of applying an inhibitory resin to at least one of the contaminant and a region in a vicinity of the contaminant based on the position information, the inhibitory resin being a resin which inhibits the contaminant from absorbing the raw material liquid.

Advantageous Effects of Invention

According to the present disclosure, even when a contaminant is stuck to the surface of a board before a printing process, it is possible to inhibit absorption of a raw material liquid by the contaminant and to reduce the difference in luminance between the part where the contaminant is stuck and the other part where no contaminant is stuck when the organic EL display panel is used as a product.

DESCRIPTION OF EMBODIMENTS

Figure 1:
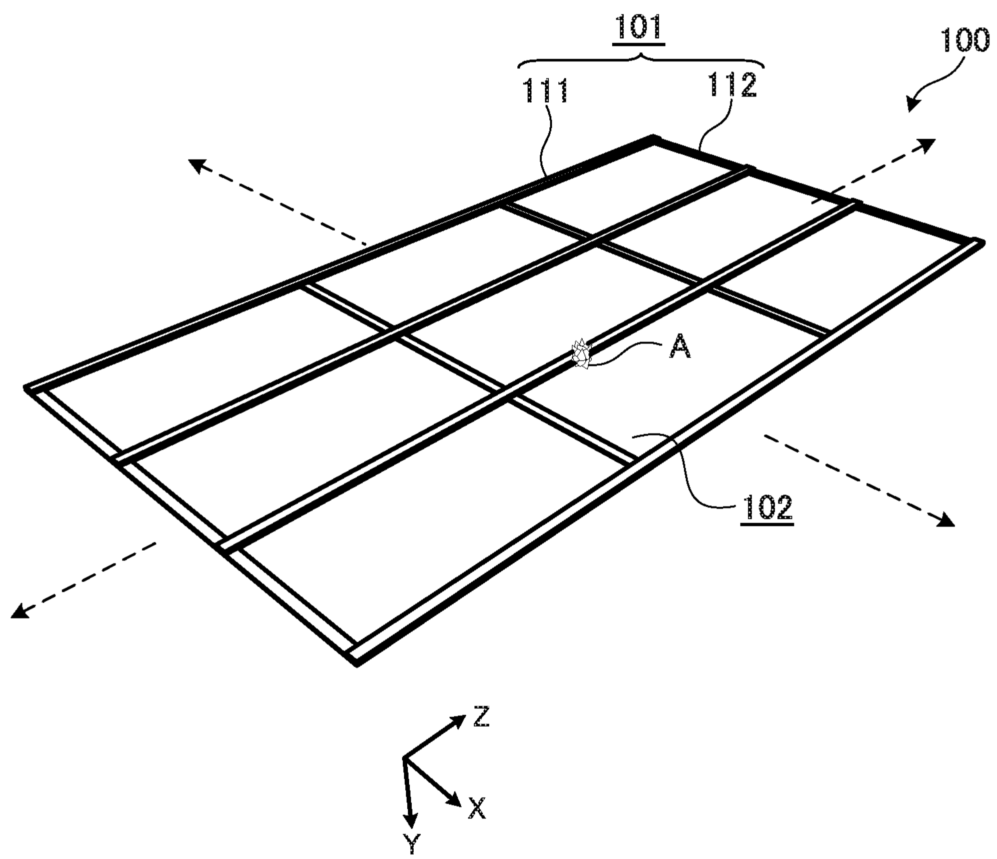
FIG. 1 is a perspective view schematically illustrating a board during manufacturing of an organic EL display panel.

FIG. 1 is a perspective view schematically illustrating a board during manufacturing of an organic EL display panel.

A board 100 illustrated in FIG. 1 is a board 100 immediately before a printing process, and has a surface on which banks (partitions) 101 are disposed in a lattice pattern. The banks 101 include longitudinal banks 111 extending in the longitudinal direction (Z-axis direction in the drawings) and lateral banks 112 extending in the lateral direction (X-axis direction in the drawings). Although FIG. 1 shows, for the purpose of illustration, a contaminant A stuck to the board 100 at some stage before the printing process, the contaminant A is an object accidently stuck to the board 100 with some probability.

In the case of performing the printing process of applying a raw material liquid 200 (that is, ink) containing an organic EL material to the board 100 on which the contaminant A is accidentally stuck, the countermeasures generally considered are to apply a smaller amount of the raw material liquid 200 to a light-emitting pixel 102 in which the contaminant A is present, than to a light-emitting pixel 102 in which the contaminant A is absent. This is because the capacity of the light-emitting pixel 102 in which the contaminant A is present is smaller, by the contaminant A, than the capacity of the light-emitting pixel 102 in which the contaminant A is absent.

In view of this, the inventor attempted to optimize the condition for the application of the raw material liquid, by diligently conducting experiments and studies under various conditions of applying a smaller amount of the raw material liquid to the light-emitting pixel 102 in which the contaminant A is present. As a result, the inventor discovered that applying a smaller amount of the raw material liquid to the light-emitting pixel 102 in which the contaminant A is present is likely to result in the luminance of the light-emitting pixel 102 in which the contaminant A is present being higher than the luminance of the light-emitting pixel 102 in which the contaminant A is absent.

Figure 2:
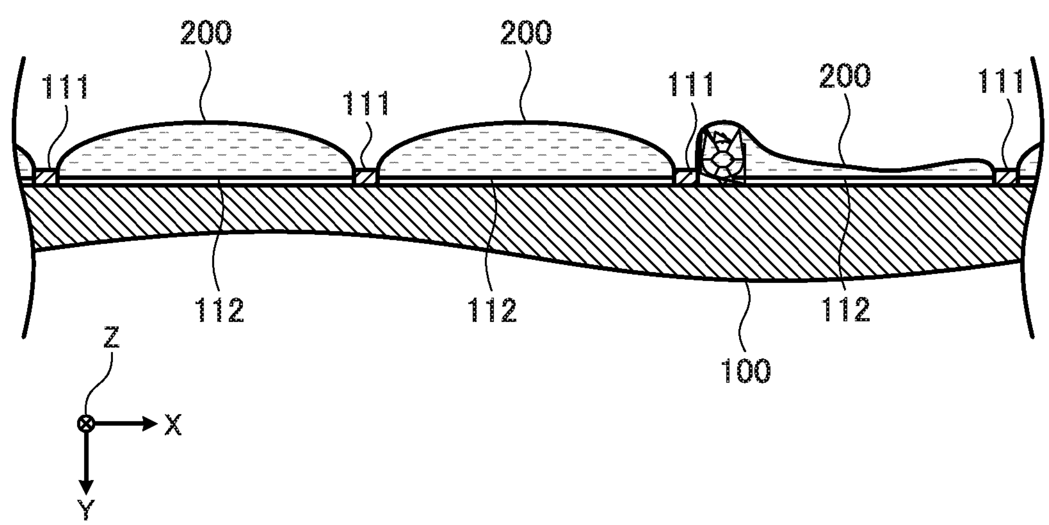
FIG. 2 is a cross-sectional view schematically illustrating a board which is immediately after a printing process and to which a contaminant is stuck.

In view of this, the inventor conducted further experiments and studies, and discovered that the reason why the luminance of the light-emitting pixel 102 in which the contaminant A is present becomes higher is because the layer formed by applying the raw material liquid 200 becomes thinner. The inventor discovered that the reason why the layer formed by applying the raw material liquid 200 becomes thinner is because, as illustrated in FIG. 2, the raw material liquid 200 is soaked up by the contaminant A due to a phenomenon which can be described as capillary action of the contaminant A, thus decreasing the amount of the raw material liquid 200 applied to the part other than the part where the contaminant A is present. That is to say, the inventor has gained a new finding that the presence of the contaminant A in the light-emitting pixel 102 does not decrease the capacity of the light-emitting pixel 102 but rather increases the capacity of the light-emitting pixel 102.

The present disclosure is based on the above-described new finding and is based on an idea opposite to the countermeasures that a typical engineer would generally consider. Hereinafter, embodiments will be described with reference to the drawings as necessary. Note, however, that detailed descriptions may be omitted where unnecessary. For example, detailed descriptions of well-known aspects or repetitive descriptions of essentially similar configurations may be omitted. This is to make the following description easier for those skilled in the art to understand and avoid redundancy.

Note that the inventor provides the accompanying drawings and the following description, not to limit the scope of the claims, but to aid those skilled in the art to adequately understand the present disclosure.

Embodiment 1

Outline of Organic EL Display Panel

Figure 3:
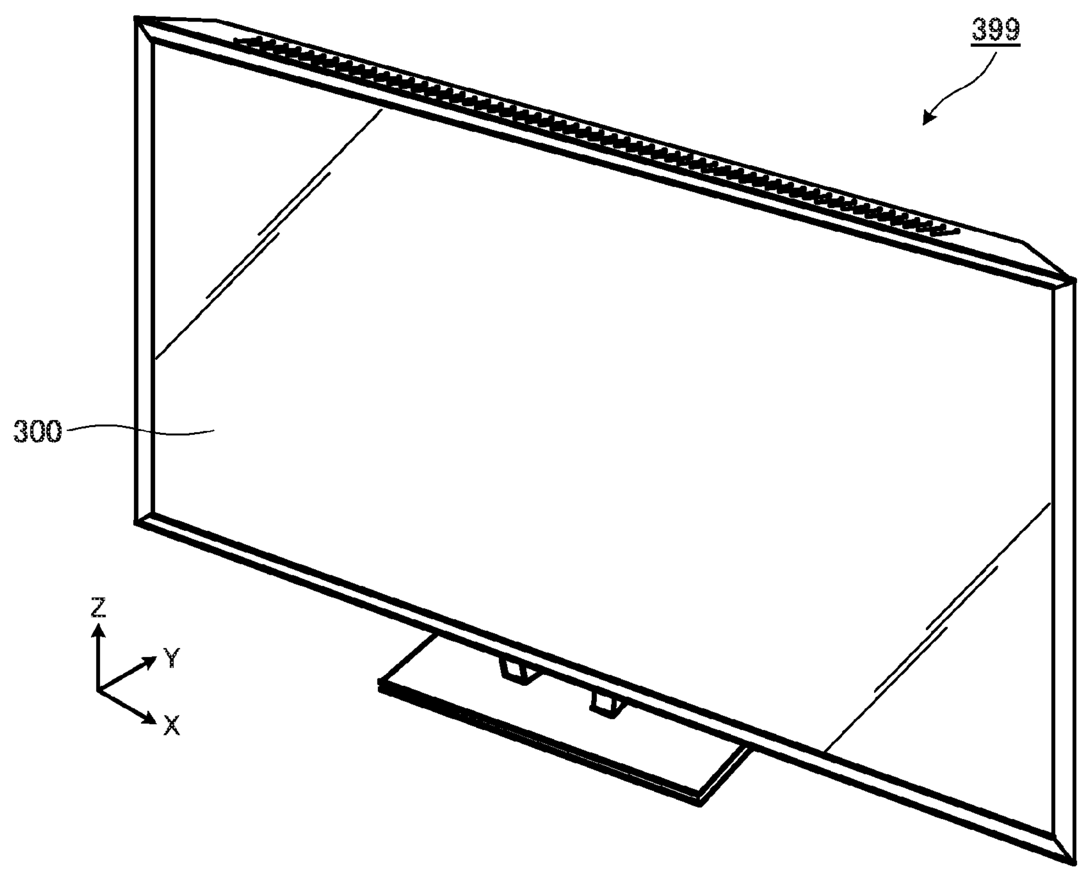
FIG. 3 is a perspective view of a television which includes an organic EL display panel.

An organic EL display panel 300 is, as illustrated in FIG. 3 for example, an apparatus that displays videos, images, characters, and so on, and is a display apparatus manufactured from the board 100 as illustrated in FIG. 1. For example, the organic EL display panel 300 is built into a television 399 which outputs videos obtained from received broadcast waves and the like. The organic EL display panel 300 includes, as light-emitting elements, organic electroluminescent (EL) diodes that are light-emitting diodes each including a luminescent layer formed using an organic EL material. In the present disclosure, printing is adopted as the method for forming the luminescent layer using the organic EL material. The present embodiment in particular adopts a printing method where two or more types (three types in the present embodiment) of raw material liquids 200 each containing an organic EL material corresponding to a light-emitting color are discharged between predetermined banks 101, so that the areas between the banks 101 are filled with the raw material liquids 200.

[System for Manufacturing Organic EL Display Panel]

Figure 4:
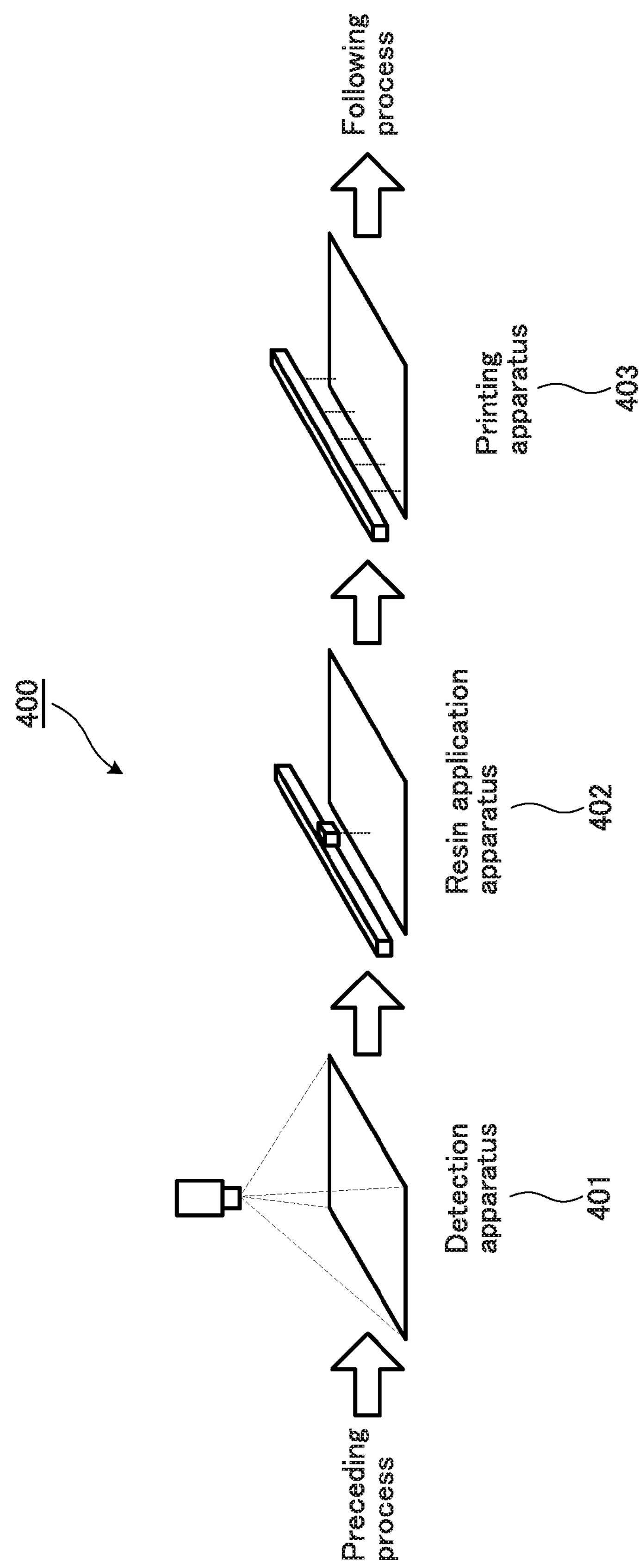
FIG. 4 is a schematic view of a system for manufacturing an organic EL display panel.

FIG. 4 is a schematic view of a system for manufacturing an organic EL display panel.

As illustrated in FIG. 4, a manufacturing system 400 includes a detection apparatus 401, a resin application apparatus 402, and a printing apparatus 403.

Note that these apparatuses are connected via a conveyor, and may be placed in a chamber.

The detection apparatus 401 is an apparatus that detects the contaminant A present on a surface of the board 100 on which a plurality of banks 101 are formed in a preceding process, and generates position information indicating the position of the contaminant A with respect to the board 100. In the present embodiment, the detection apparatus 401 performs the following: obtains an image of the board 100 as data, using a camera; analyzes the image to detect whether or not a contaminant A is present; and if a contaminant A is present, generates position information about the contaminant A. Note that the position information is information representing a position on the surface of the board 100 using two-dimensional data, with a reference position provided on the board 100 to serve as the point of origin, for example.

Note that the detection apparatus 401 is not limited to an apparatus which detects the contaminant A by analyzing the image obtained by the camera, and is not limited to anything in particular as long as the presence and absence of the contaminant A as well as the position of the contaminant A can be detected. For example, such detection can be performed using laser light.

The resin application apparatus 402 is an apparatus that applies an inhibitory resin to at least one of the contaminant A and a region in the vicinity of the contaminant A, based on the position information generated by the detection apparatus 401. Here, the inhibitory resin is a resin which inhibits the contaminant A from absorbing the raw material liquid 200.

More specifically, the inhibitory resin is a resin which can inhibit or prevent the absorption of the raw material liquid 200, especially the organic EL material contained in the raw material liquid 200, by the contaminant A. The material of the inhibitory resin is not limited to anything in particular, but a lyophobic resin is preferable which has low compatibility with the raw material liquid 200 (especially the solvent), does not easily dissolve in the raw material liquid 200, or has low miscibility with the raw material liquid 200. This is because the inhibitory resin comes in contact with the raw material liquid 200 with which the areas between the banks 101 are to be filled. Moreover, a liquid repellent resin having low wettability with the raw material liquid 200 is preferable. More specifically, as the inhibitory resin, it is preferable to use the same resin as the resin used for the banks 101. The resin used for the banks 101 is particularly preferable because it has lyophobicity and liquid repellency. It is also because the resin used for the banks 101 does not have an adverse effect on the organic EL display panel 300 but rather maintains the organic EL display panel 300 in a stable condition even when the organic EL display panel 300 is used in a product with the resin for the banks 101 in contact with an organic EL material or other materials.

The method with which the resin application apparatus 402 applies the inhibitory resin is not limited to anything in particular. Examples include a jet dispensing method, a syringe method, and a tubing method. The present embodiment adopts the jet dispensing method with which the resin application apparatus 402 discharges the inhibitory resin in the form of droplets to apply to a predetermined place. Adopting the jet dispensing method for the resin application apparatus 402 is preferable because it allows accurate application of the inhibitory resin to a minute contaminant A based on the position information without being hindered by the banks 101, and it allows accurate control and awareness of the amount of inhibitory resin applied.

The printing apparatus 403 is an apparatus that applies the raw material liquid 200 containing an organic EL material between the banks 101 of the board 100. Examples of the printing apparatus 403 include an apparatus which applies the raw material liquid 200 using the jet dispensing method. In the present embodiment, the printing apparatus 403 is an apparatus that includes a head having multiple discharge holes arranged in a line or in a narrow band-like region. The head can control discharge of the raw material liquid 200 from each of the discharge holes. Such a printing apparatus 403 can apply any given type of raw material liquid 200 (for example, a raw material liquid 200 containing an organic EL material corresponding to R, G, or B) to any given position of the board 100 by moving the head and the board 100 relative to each other.

Note that the processes following the printing process performed by the printing apparatus include: a process performed by a drying furnace for drying the applied raw material liquid 200 to form a layer of the organic EL material; and a process performed by a baking furnace for further drying and baking the layer of the organic EL material.

[Method for Manufacturing Organic EL Display Panel]

Next, a method for manufacturing the organic EL display panel 300 will be described.

Figure 5:
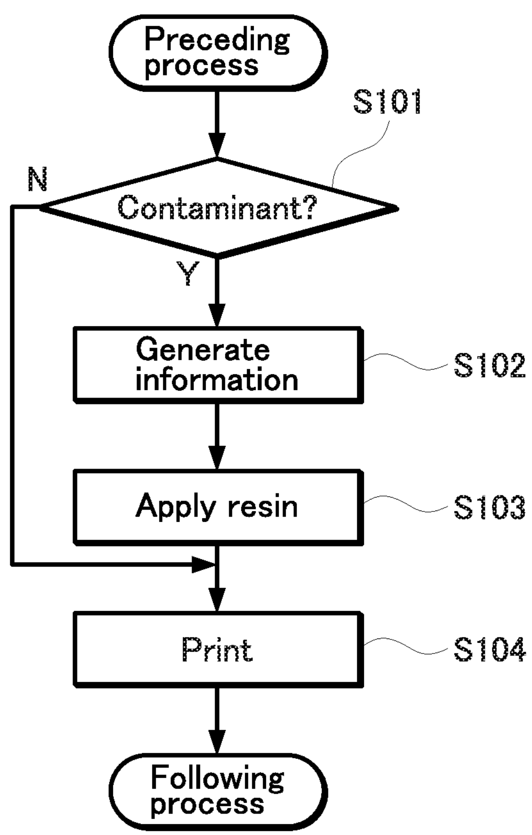
FIG. 5 is a flow chart illustrating a method for manufacturing an organic EL display panel.

FIG. 5 is a flow chart illustrating a method for manufacturing an organic EL display panel.

As illustrated in FIG. 5, from the board 100 on which a plurality of banks 101 are disposed in the preceding process, the detection apparatus 401 detects a contaminant A present on a surface of the board 100 on which the banks 101 are disposed (S101: detection process).

If the contaminant A is detected in the detection process (S101) (Y in S101), the detection apparatus 401 generates position information indicating the position of the contaminant A with respect to the board 100 (S102: information generation process). In the present embodiment, the detection apparatus 401 also generates size information indicating the size of the contaminant A in the information generation process S102.

Next, based on the position information generated in the information generation process (S102), the inhibitory resin that inhibits the contaminant A from absorbing the raw material liquid 200 is applied to at least one of the contaminant A and a region in the vicinity of the contaminant A (S103: resin application process).

Figure 6:
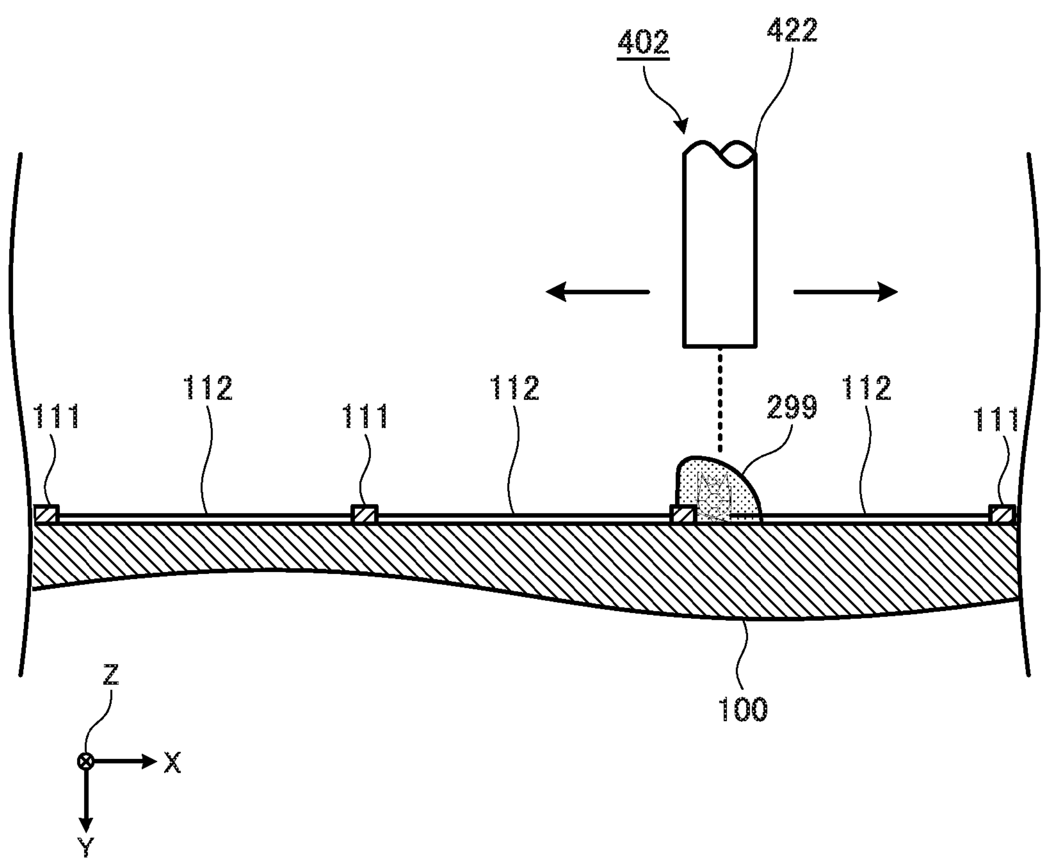
FIG. 6 is a side view schematically illustrating a resin application apparatus that performs a resin application process.

FIG. 6 is a side view schematically illustrating a resin application apparatus that performs the resin application process.

For example, as illustrated in FIG. 6, the resin application apparatus 402 includes a head 421 which can freely move along a horizontal plane (in FIG. 6, the XZ plane parallel to the surface of the board 100) based on the position information. The head 421 can discharge an inhibitory resin 299 using the jet dispensing method.

The resin application apparatus 402 positions a nozzle 422 of the head 421 above the contaminant A based on the position information, and applies to the contaminant A the inhibitory resin 299 in an amount corresponding to the size information.

By doing so, the contaminant A is covered with the inhibitory resin 299, and the absorption of the raw material liquid 200 by the contaminant A is inhibited.

Next, the printing apparatus 403 applies the raw material liquid 200 containing the organic EL material to each of the areas between the plurality of banks 101 disposed on the board 100 (S104: printing process).

Figure 7:
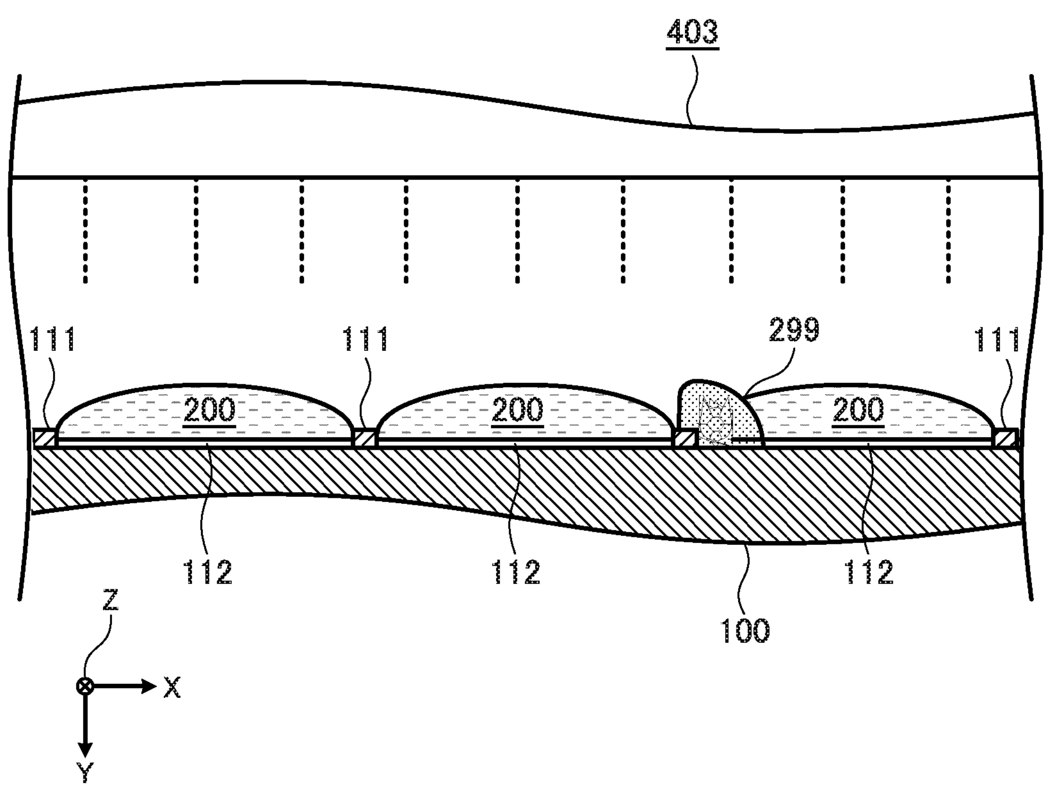
FIG. 7 is a side view schematically illustrating a printing apparatus that performs a printing process.

FIG. 7 is a side view schematically illustrating a printing apparatus that performs the printing process.

For example, as illustrated in FIG. 7, the printing apparatus 403 includes a plurality of discharge holes arranged one-dimensionally in the X-axis direction of FIG. 7, and applies the raw material liquid 200 between the banks 101 while moving the discharge holes and the board 100 relative to each other.

In this case, even if the contaminant A is present between the banks 101, the contaminant A is covered with the inhibitory resin 299 and thus the contaminant A does not absorb the raw material liquid 200. Therefore, the amount of the raw material liquid 200 applied between the banks 101 where the contaminant A is present is substantially the same as the amount of the raw material liquid 200 containing the organic EL material contributing to the light emission.

Thus, the thickness of the organic EL material adhered to the board 100 by drying the raw material liquid 200 in the following process becomes substantially uniform irrespective of whether or not the contaminant A is present.

Furthermore, by adopting the above manufacturing method, it is possible to manufacture the organic EL display panel 300 including, between the banks 101, the inhibitory resin that covers the contaminant A or is applied to a region in the vicinity of the contaminant A. The organic EL display panel 300 can inhibit the emergence of a light-emitting pixel 102 having an abnormally high luminance when the same voltage is applied to all the light-emitting pixels 102.

Next, a variation of the resin application process will be described.

[Variation 1]

Figure 8:
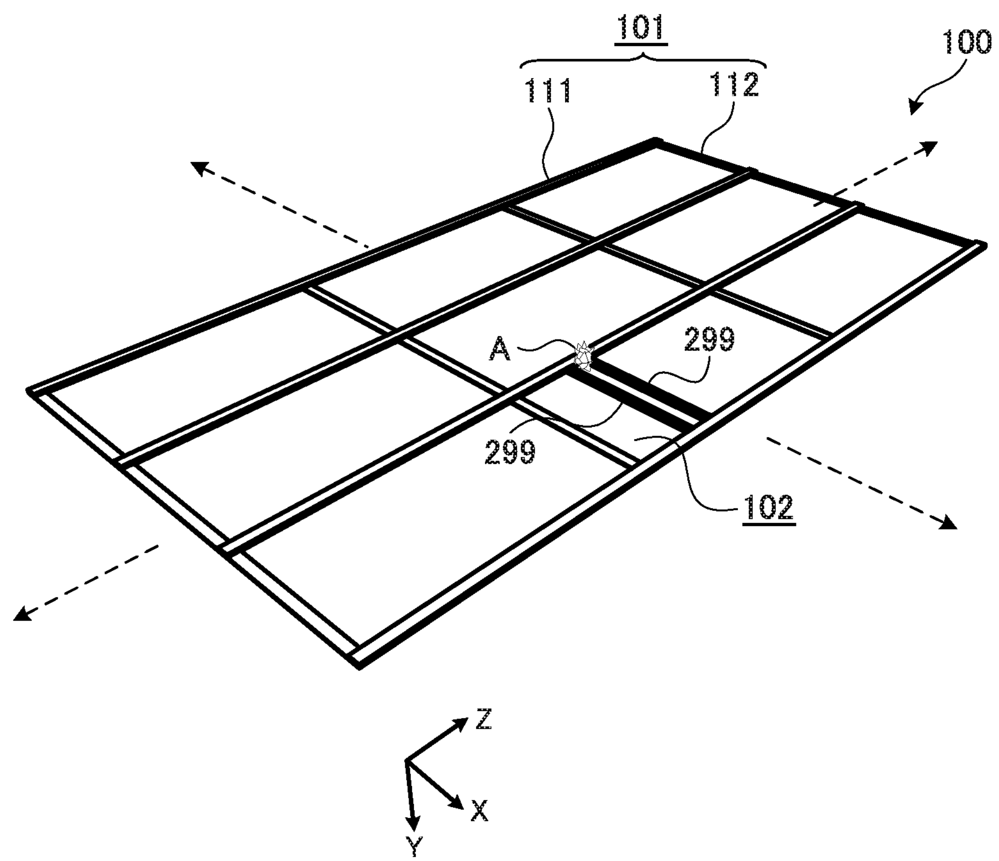
FIG. 8 is a perspective view schematically illustrating a board after a resin application process according to Variation 1 of Embodiment 1.

FIG. 8 is a perspective view schematically illustrating a board after a resin application process according to Variation 1 of Embodiment 1.

As illustrated in FIG. 8, in the resin application process (S103), instead of directly applying the inhibitory resin 299 to the contaminant A, the inhibitory resin 299 may be applied to a region in the vicinity of the contaminant A as long as such a manner of application allows the inhibitory resin 299 to inhibit the contaminant A from absorbing the raw material liquid 200.

[Variation 2]

Figure 9:
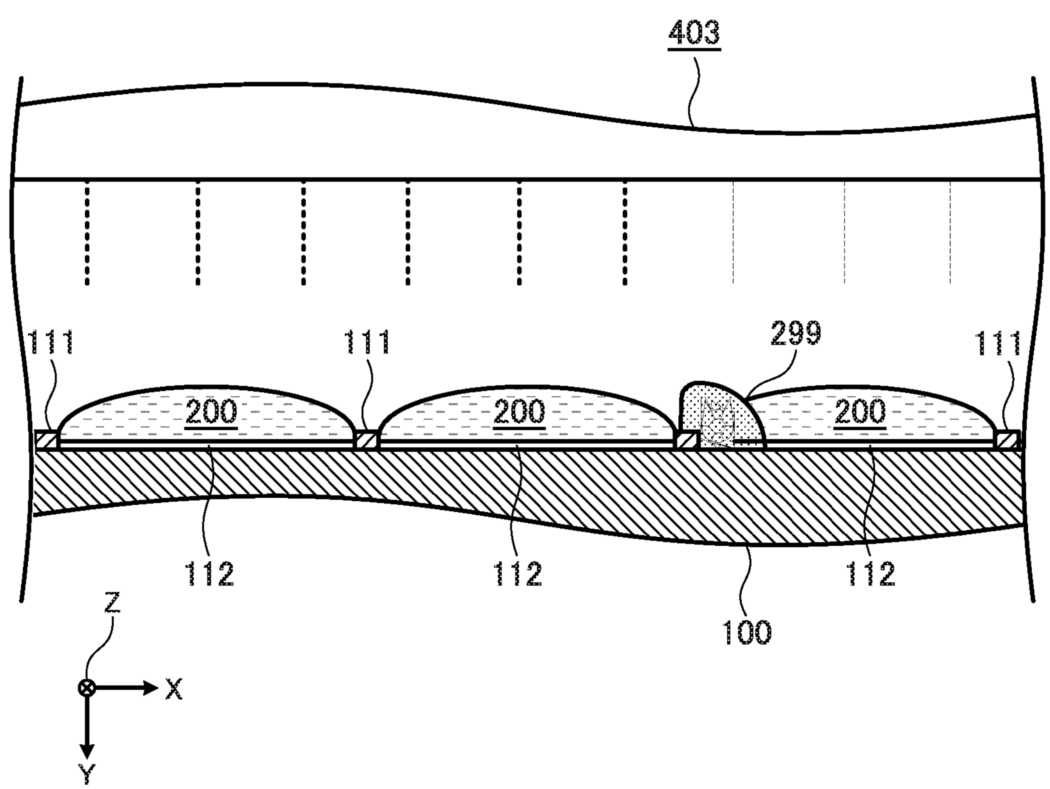
FIG. 9 is a side view schematically illustrating a printing apparatus that performs a printing process according to Variation 2 of Embodiment 1.

FIG. 9 is a side view schematically illustrating a printing apparatus that performs a printing process according to Variation 2 of Embodiment 1.

In the printing process (S104), the amount of the raw material liquid 200 to be applied between the banks 101 where the inhibitory resin 299 has been applied may be smaller than the amount of the raw material liquid 200 to be applied if the contaminant A is absent, as illustrated in FIG. 9. In this case, the amount of the raw material liquid 200 may be smaller by an amount equal to the amount of the inhibitory resin 299 applied by the resin application apparatus 402 in the resin application process (S103). Moreover, the amount of the raw material liquid 200 may be smaller based on the amount of the inhibitory resin 299 applied by the resin application apparatus 402 and the size information generated by the detection apparatus 401.

This makes it possible to adjust the amount of the raw material liquid 200 to be applied, based on the area of the light-emitting pixel 102 reduced by the contaminant A and the amount of the inhibitory resin 299 applied. This enables, in the following process, accurate adjustment of the thickness of the organic EL material that is adhered to the board 100 by drying the raw material liquid 200. Note that Variation 2 is effective especially when the size of the contaminant A is large.

Embodiment 2

System for Manufacturing Organic EL Display Panel

Figure 10:
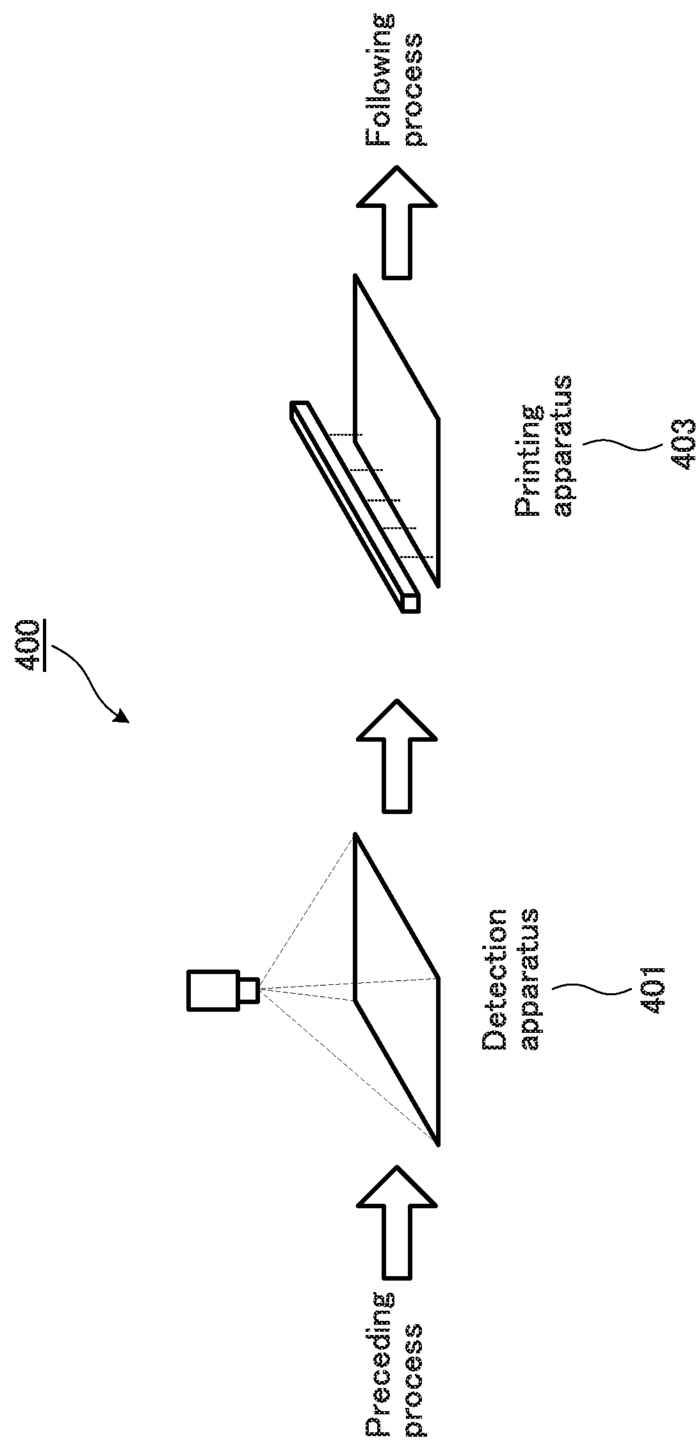
FIG. 10 is a schematic view of a system for manufacturing an organic EL display panel according to Embodiment 2.

FIG. 10 is a schematic view of a system for manufacturing an organic EL display panel according to Embodiment 2.

As illustrated in FIG. 10, the manufacturing system 400 includes a detection apparatus 401 and a printing apparatus 403.

Note that these apparatuses are the same as the above-described apparatuses, and thus the same reference signs are given and detailed descriptions are omitted.

[Method for Manufacturing Organic EL Display Panel]

Next, a method for manufacturing the organic EL display panel 300 according to Embodiment 2 will be described.

Figure 11:
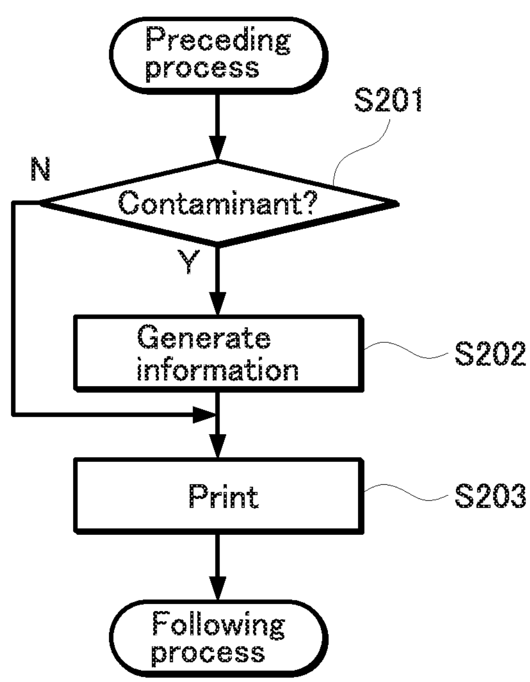
FIG. 11 is a flow chart illustrating a method for manufacturing an organic EL display panel according to Embodiment 2.

FIG. 11 is a flow chart illustrating a method for manufacturing an organic EL display panel according to Embodiment 2.

As illustrated in FIG. 11, from the board 100 on which a plurality of banks 101 are disposed in the preceding process, the detection apparatus 401 detects a contaminant A present on a surface of the board 100 on which the banks 101 are disposed (S201: detection process).

If the contaminant A is detected in the detection process (S201) (Y in S201), the detection apparatus 401 generates position information indicating the position of the contaminant A with respect to the board 100 (S202: information generation process). In the present embodiment, the detection apparatus 401 also generates size information indicating the size of the contaminant A in the information generation process S202.

Figure 12:
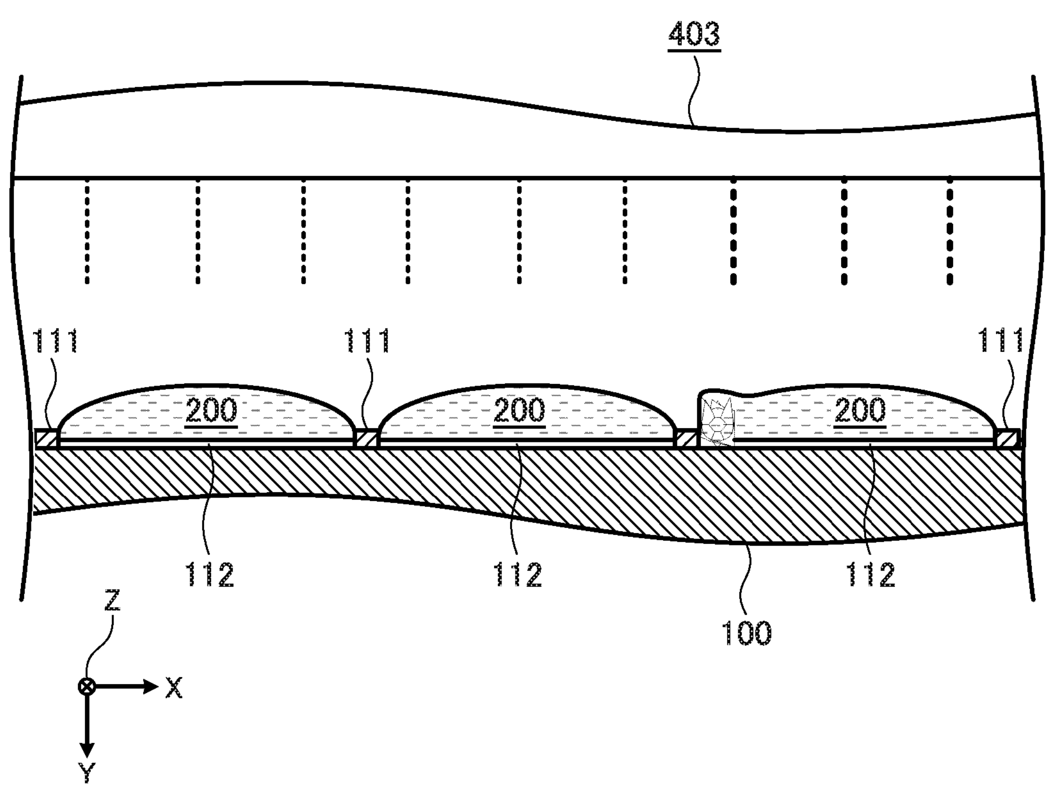
FIG. 12 is a side view schematically illustrating a printing apparatus that performs a printing process according to Embodiment 2.

Next, based on the position information generated in the information generation process (S202), the printing apparatus 403 applies the raw material liquid 200 containing the organic EL material to each of the areas between the plurality of banks 101 disposed on the board 100 (S203: printing process). In the present embodiment, as illustrated in FIG. 12, the printing apparatus 403 applies an amount of the raw material liquid 200 between the banks 101 where the contaminant A is present based on the position information, which is larger than the amount of the raw material liquid 200 to be applied if the contaminant A is absent. By doing so, the printing apparatus 403 makes the substantial filling amount of the raw material liquid 200 to be applied between the banks 101 where the contaminant A is present (that is, the amount of the raw material liquid 200 excluding the amount of the raw material liquid 200 absorbed by the contaminant A) equal to the amount of the raw material liquid 200 applied between the other banks 101.

More specifically, the amount of the raw material liquid 200 to be applied may be increased based on the size information generated by the detection apparatus 401.

With this, increasing the amount of the raw material liquid 200 to be applied enables compensation for the organic EL material not contributing to the light emission due to the absorption by the contaminant A. As a result, the substantial amount of the raw material liquid 200 applied between the banks 101 where the contaminant A is present is made substantially equal to the amount of the raw material liquid 200 applied between the other banks 101.

Thus, the thickness of the organic EL material adhered to the board 100 by drying the raw material liquid 200 in the following process becomes substantially uniform irrespective of whether or not the contaminant A is present. It is therefore possible to manufacture the organic EL display panel 300 that inhibits the emergence of a light-emitting pixel 102 having an abnormally high luminance when the same voltage is applied to all the light-emitting pixels 102.

Other Embodiments

As shown above, Embodiments 1 and 2 and variations have been described by way of example to illustrate the technique disclosed in the present application. However, the technique according to the present disclosure is not limited to these embodiments and variations, and is also applicable to other embodiments conceived by various modifications, permutations, additions, and omissions in the above-described embodiments and variations. Moreover, the structural elements described in Embodiment 1 and the variations may be combined to create a new embodiment.

For example, the organic EL display panel 300 in Embodiment 1 is included in a television. The organic EL display panel 300, however, may be used for equipment other than television. For example, the organic EL display panel 300 may be used for: a monitor apparatus that displays videos received from outside; digital signage used as advertising media; and a mobile terminal, a tablet terminal, and a table-type organic EL display panel 300 that receive a user operation via a touch panel.

As shown above, embodiments have been described by way of example to illustrate the technique according to the present disclosure. The accompanying drawings and detailed description are provided for this purpose.

Thus, the structural elements set forth in the accompanying drawings and the detailed description include not only the structural elements essential to solve the problems but also structural elements unnecessary to solve the problems, for the purpose of illustrating the above technique by way of example. For this reason, those unnecessary structural elements should not be deemed essential due to the mere fact that they appear in the accompanying drawings and the detailed description.

The above-described embodiments illustrate the technique according to the present disclosure by way of example, and thus various modifications, permutations, additions, and omissions are possible in the scope of the appended claims and the equivalents thereof.

For example, although the above embodiments have described, by way of example, the board 100 on which line banks are disposed, the banks disposed on the board are not limited to the line banks only. It is also possible to use, for example, a board 100 which has longitudinal banks 111 and lateral banks 112 having the same height and to which the raw material liquid 200 is applied on a per-light-emitting-pixel-102 basis.

INDUSTRIAL APPLICABILITY

The present disclosure relates to a method for manufacturing an organic EL display panel 300 that displays images, characters, and videos, and a system for manufacturing the organic EL display panel 300. The present disclosure is applicable particularly to a large organic EL display panel 300. More specifically, the present disclosure is applicable to electronic devices such as a television, a monitor display, digital signage, a mobile terminal, a tablet terminal, and a table-type organic EL display panel 300.

REFERENCE SIGNS LIST

100 board
101 bank
102 light-emitting pixel
111 longitudinal bank
112 lateral bank
200 raw material liquid
299 inhibitory resin
300 organic EL display panel
399 television
400 manufacturing system
401 detection apparatus
402 resin application apparatus
403 printing apparatus
421 head
422 nozzle

The invention claimed is:

1. A method for manufacturing an organic electroluminescent (EL) display panel through a printing process of applying a raw material liquid between a plurality of banks disposed on a board, the raw material liquid containing an organic EL material, the method comprising, before the printing process:

a detection process of detecting a contaminant present on a surface of the board on which the plurality of banks are disposed;

an information generation process of generating, when the contaminant is detected, position information indicating a position of the contaminant with respect to the board and size information indicating a size of the contaminant; and a resin application process of applying an inhibitory resin to at least one of the contaminant and a region in a vicinity of the contaminant based on the position information, the inhibitory resin being a resin which inhibits the contaminant from absorbing the raw material liquid, wherein in the printing process, an amount of the raw material liquid to be applied between banks, among the banks, where the inhibitory resin has been applied is smaller than an amount of the raw material liquid to be applied when the contaminant is absent, based on the size information.

2. The method for manufacturing an organic EL display panel according to claim 1, wherein the inhibitory resin has liquid repellency and repels the raw material liquid.

3. A method for manufacturing an organic electroluminescent (EL) display panel through a printing process of applying a raw material liquid between a plurality of banks disposed on a board, the raw material liquid containing an organic EL material, the method comprising, before the printing process:

a detection process of detecting a contaminant present on a surface of the board on which the plurality of banks are disposed, and generating position information indicating a position of the contaminant with respect to the board and size information indicating a size of the contaminant, wherein in the printing process, an amount of the raw material liquid to be applied between banks, among the plurality of the banks, where the contaminant is present is larger than an amount of the raw material liquid to be applied when the contaminant is absent, based on the position information and the size information.

4. A system for manufacturing an organic electroluminescent (EL) display panel, the system comprising:

a detection apparatus that detects a contaminant present on a surface of a board on which a plurality of banks are disposed, and generates position information indicating a position of the contaminant with respect to the board and size information indicating a size of the contaminant;

a resin application apparatus that applies an inhibitory resin to at least one of the contaminant and a region in a vicinity of the contaminant based on the position information, the inhibitory resin being a resin which inhibits the contaminant from absorbing a raw material liquid containing an organic EL material; and a printing apparatus that applies the raw material liquid between the plurality of banks disposed on the board, the raw liquid being applied in an amount corresponding to the size information.

5. A method for manufacturing an organic electroluminescent (EL) display panel through a printing process of applying a raw material liquid between a plurality of banks disposed on a board, the raw material liquid containing an organic EL material, the method comprising, before the printing process:

a detection process of detecting a contaminant present on a surface of the board on which the plurality of banks are disposed;

an information generation process of generating, when the contaminant is detected, position information indicating a position of the contaminant with respect to the board and size information indicating a size of the contaminant; and a resin application process of applying an inhibitory resin to only a region in a vicinity of the contaminant based on the position information and the size information, the inhibitory resin being a resin which inhibits the contaminant from absorbing the raw material liquid.

* * * * *